United States Patent
Chang et al.

[11] Patent Number: 6,034,552
[45] Date of Patent: Mar. 7, 2000

[54] OUTPUT ESD PROTECTION USING DYNAMIC-FLOATING-GATE ARRANGEMENT

[75] Inventors: Hun-Hsin Chang, Taipei; Ming-Dou Ker, Hsinchu; Kuo-Tsai Lee, Hsin-Chu; Wen-Hsiang Huang, Kaoshiung, all of Taiwan

[73] Assignee: Taiwan Semiconductor Manufacturing Co., Ltd., Hsin-Chu, Taiwan

[21] Appl. No.: 09/070,529

[22] Filed: Apr. 30, 1998

[51] Int. Cl.[7] .................. H03K 19/0175; H03K 19/094; H02H 9/00; H02H 3/22

[52] U.S. Cl. .................. 326/83; 326/50; 326/86; 361/56; 361/111; 257/358

[58] Field of Search .................. 326/83, 86, 49, 326/50; 361/56, 111; 257/358, 357

[56] References Cited

U.S. PATENT DOCUMENTS

| | | | |
|---|---|---|---|
| 5,345,356 | 9/1994 | Pianka | 361/56 |
| 5,345,357 | 9/1994 | Pianka | 361/56 |
| 5,631,793 | 5/1997 | Ker et al. | 361/56 |
| 5,745,323 | 4/1998 | English et al. | 361/56 |
| 5,781,388 | 7/1998 | Quigley | 361/56 |
| 5,877,930 | 3/1999 | Gist | 361/111 |

*Primary Examiner*—Michael Tokar
*Assistant Examiner*—Daniel D. Chang
*Attorney, Agent, or Firm*—Tung & Associates

[57] ABSTRACT

A dynamic-floating-gate arrangement is used to improve the ESD robustness of driving-current-programmable CMOS output buffers in cell libraries, by suitably dynamically floating the gates of the NMOS/PMOS buffers using a small-dimension CMOS device having its drain connected to the gate of an unused CMOS buffer, its source connected to one of two voltage sources, and its gate connected between a resistance, that is connected between the two voltage sources, and a capacitance connected between the resistance and the same one of the two voltage sources as the source of the small-dimension CMOS device.

20 Claims, 6 Drawing Sheets

(1) PS - mode (2) NS - mode (3) PD - mode (4) ND - mode 6,034,552

OUTPUT ESD PROTECTION USING DYNAMIC-FLOATING-GATE ARRANGEMENT

FIELD OF THE INVENTION

The present invention generally relates to electrostatic discharge (ESD) protection for integrated circuits (ICs) and, more particularly, to a dynamic-floating-gate arrangement for IC metal-oxide-semiconductor (MOS) devices which improves the ESD robustness of driving-current-programmable CMOS output buffers in cell libraries, such as the Taiwan Semiconductor Manufacturing Company (TSMC) cell library, and effectively improves the ESD level of the output buffers.

BACKGROUND OF THE INVENTION

The electrostatic discharge (ESD) robustness of CMOS ICs has been found to be seriously degraded by advanced deep-submicron CMOS technologies, as reported, for example, by S. Voldman and V. Gross in "Scaling, optimization and design consideration of electrostatic discharge protection circuits in CMOS technology," 1993 EOS/ESD Symposium Proceedings, pp. 251–260, and A. Amerasekera and C. Duvvury in "The impact of technology scaling on ESD robustness and protection circuit design," 1994 EOS/ESD Symposium Proceedings, pp. 237–245. As a result, it is necessary to improve ESD protection for the output buffers in these ICs through either process modification, such as discussed by S. Daniel and G. Krieger, in "Process and design optimization for advanced CMOS I/O ESD protection devices," 1990 EOS/ESD Symposium Proceedings, pp. 206–213, or by more effective ESD protection circuit design. To improve the ESD robustness of the output transistors in such circuits, the symmetrical layout structure has been greatly emphasized to realize large-dimension output transistors for ensuring the uniform turn-on phenomenon along the multiple fingers of the output transistors, as explained, for instance, by T. L. Polgreen and A. Chattejee, in "Improving the ESD failure threshold of silicided nMOS output transistors by ensuring uniform current flow," IEEE Trans. Electron Devices, vol.39, pp. 379–388, 1992, and S. G. Beebe, in "Methodology for layout design and optimization of ESD protection transistors," 1996 EOS/ESD Symposium Proceedings, pp. 265–275. To additionally enhance the uniform turn-on phenomenon among the multiple fingers of an output NMOS, a dynamic-gate-coupling design to achieve uniform ESD power distribution of the large-dimension output NMOS has been reported by C. Duvvury and C. Diaz, in "Dynamic gate coupling of NMOS for efficient output ESD protection," Proc. of IRPS, 1992, pp. 141–150.

In practical applications, the output buffers in a cell library have different driving current specifications. For example, the output buffers may have driving capabilities of 2 mA, 4 mA, 8 mA, . . . , or 24 mA as in the TSMC cell library. But, the cell layouts of these output buffers with different driving capabilities are drawn in the same layout style and area. To provide different output driving currents, different fingers of the poly gates in the output buffers, e.g., N-channel-type metal-oxide-semiconductor (NMOS) buffers, are connected to the pre-buffer circuit, while the other unused poly-gate fingers are connected to ground. An example of a typical layout of a finger-type output NMOS with a small driving current is shown in FIG. 1(a), and the equivalent circuit is shown in FIG. 1(b). In FIG. 1(a) there are ten poly-gate fingers (F) in the NMOS layout, but only one poly-gate finger (Mn1) is connected to the pre-buffer circuit (12) to provide the sinking current from the output pad (10). The other nine poly-gate fingers F are unused, but inside the layout, and are all connected to ground. The common grounding of these NMOS fingers, shown as Mn2 in FIG. 1(b), turns them OFF. Due to the asymmetrical connection of these poly-gate fingers F of the output NMOS in the layout, the ESD turn-on phenomena among the fingers are quite different. The Mn1 with a small channel width is often turned ON first and damaged by the ESD voltage, whereas the unused Mn2 with a much larger (9X) channel width is always OFF during the ESD stress. This generally causes a very low ESD level for the output buffer even with a total large device dimension (Mn1+Mn2).

To improve the turn-on uniformity of the output buffers with different driving/sinking currents and also to protect the thinner gate oxide of the output buffers in the TSMC CMOS cell library, it has been suggested that the poly gates of the unused NMOS and/or PMOS in the output buffers be respectively connected to a voltage source VSS and a voltage source VDD, through a small-dimension NMOS Mdn1 and PMOS Mdp1, as shown in FIG. 2 (also see "Electrostatic discharge protection circuit," U.S. Pat. No. 5,086,365 to C. -D. Lien). The small dimension Mdn1 (or Mdp1) provides the function of a resistor to protect the thinner gate oxide of unused Mn2 (or Mp2) and also sustains the ESD-transient coupling voltage on the gate of Mn2 (or Mp2) to help the uniform turn-on phenomenon among the multiple fingers of the Mn1 and Mn2 (or Mp1 and Mp2). The small dimension Mdn1 (or Mdp1) cooperating with the parasitic drain-to-gate capacitance Cn2 in Mn2 (or Cp2 in Mp2) performs a gate-coupling effect to turn ON the unused Mn2 (or Mp2) during the ESD stress (see M. -D. Ker et al, "Capacitor-couple ESD protection circuit for deep-submicron low-voltage CMOS ASIC," IEEE Transactions on VLSI Systems, Vol.4, pp. 307–321, 1996).

The ESD test to verify the ESD level of an output pin is shown in FIG. 3, where there are four modes of testing combinations from the output pin to the VDD or VSS pins, i.e., (1) PS-mode, (2) NS-mode, (3) PD-mode, and (4) ND-mode (see EOS/ESD Standard for ESD Sensitivity Testing, EOS/ESD Association, Inc., New York, 1993). In the (4) ND-mode (or the (1) PS-mode) ESD stress, the output PMOS (or NMOS) is reverse biased and broken down by the ESD voltage. But, in the (2) NS-mode (or the (3) PD-mode) ESD stress, the parasitic drain-to-bulk diode in the NMOS (or PMOS) is forward biased to bypass the ESD current. Thus, the worst cases of ESD stresses on an output buffer are the (4) ND- and (1) PS-mode ESD events.

By way of an operating example using the NMOS devices, it will be seen that when a positive ESD voltage attaches to the output pad 10 of FIG. 2, some transient voltage is coupled through the parasitic drain-to-gate capacitors, Cn1 and Cn2, to the gates of Mn1 and Mn2. The gate of Mdn1 is biased at a high voltage because the positive ESD voltage on the pad 10 is also diverted into the VDD power line through the parasitic diode Dp2 in Mp2 (or Dp1 in Mp1). The coupled voltage, through Cn1, on the gate of Mn1 is held on its gate, but the coupled voltage, through Cn2, on the gate of Mn2 is discharged by Mdn1. This causes Mn1 to be triggered ON and damaged by the ESD energy before Mn2 is turned ON. Because Mn1 is designed with a small device dimension for a low driving-current specification (for example, 30/0.5 in the 2-mA output buffer), such an output buffer often has a low ESD level.

The human-body-model (HBM) ESD testing results of the output buffers with different driving currents in the TSMC 0.35-μm CMOS process are summarized in the following Table I.

TABLE I

| HBM ESD Stress | Output Buffers | | | | |
|---|---|---|---|---|---|
| | 2-mA Buffer | 4-mA Buffer | 8-mA Buffer | 12-mA Buffer | 24-mA Buffer |
| ND-Mode | 1.5K V | 2K V | 2.5K V | >2.5K V | >2.5K V |
| PS-Mode | 1.0K V | 1.5K V | 2.0K V | >2.5K V | >2.5K V |

Table 1 shows the HBM ESD-Sustained Level of the Driving-Current-Prograrnmable Output Buffers with the traditional gate-coupling effect. Due to the different connections on the gates of the output Mn1 and the unused Mn2, the ND-mode (or PS-mode) ESD level of the 2-mA output buffer is only 1.5 KV (or 1.0 KV). While the driving current of the output buffer may be increased by making the device dimension of Mn1 larger, the output buffer will also have a higher ESD level. Although the cell layout areas of the various output buffers (2 mA, 4 mA, . . . , 24 mA) are all the same in the cell library, the ESD levels of these output buffers are quite different. Even when using the small-dimension NMOS Mdn1 (or PMOS Mdp1) to perform the gate-coupling effect to help produce the uniform turn-on between the fingers of Mn1 and Mn2 (or Mp1 and Mp2), the HBM ESD level of the output buffer with a small Mn1 (or Mp1) but a large Mn2 (or Mp2) is still below the general industrial ESD specification of 2.0 KV.

It is therefore an object of the present invention to improve the ESD robustness of driving-current-programmable CMOS output buffers in cell libraries, such as the TSMC cell library.

It is another object of the present invention to effectively improve the ESD level of the CMOS output buffers in cell libraries.

It is a further object of the invention to provide a dynamic-floating-gate arrangement that improves the ESD robustness of driving-current-programmable CMOS output buffers in cell libraries and effectively improves the ESD level of the output buffers.

SUMMARY OF THE INVENTION

The present invention involves a method and means for creating a dynamic-floating-gate arrangement that improves the ESD level of the output buffers in cell libraries, such as the TSMC cell library, having a small driving/sinking current but with a large total layout area. In the arrangement of the invention, the output buffer of the cell has the gate of the unused NMOS (or PMOS) dynamically floated during the ESD stress, so that the unused NMOS/PMOS buffer can be turned on to bypass the ESD current. More particularly, the dynamic-floating-gate arrangement of the invention improves the ESD level of a small-driving current output buffer using a circuit configuration as shown in FIG. 4. The prior art output circuit of FIG. 2 is modified by the addition of two PMOS/NMOS devices, MR1 and MC1, which are connected to the gate of small-dimension Mdn1 to dynamically float the gate of Mn2 during the PS-mode ESD-stress condition, the gate of Mn2 being connected to the power source VSS in the normal operating condition. Two like additional NMOS/PMOS devices, MR2 and MC2, are also used to dynamically float the gate of Mp2 during the ND-mode ESD-stress condition, the gate of Mp2 being connected to the power source VDD in the normal operating condition. With this dynamic-floating-gate arrangement the unused NMOS/PMOS buffer can be turned ON to bypass the ESD current from the small-driving output buffer so that the overall ESD level of the output buffer combination in the cell library can be significantly improved.

BRIEF DESCRIPTION OF THE DRAWINGS

The objects, features and advantages of the present invention will become apparent from the following detailed description and the appended drawings in which.

DETAILED DESCRIPTION OF THE PREFERRED EMBODIMENT

The present invention is directed to improving the ESD robustness of driving-current-programmable CMOS output buffers in cell libraries, e.g., the TSMC cell library, and effectively improves the ESD level of such output buffers. The invention embodies a method and means that enhance the ESD level of the CMOS output buffers in pertinent cell libraries having a small driving/sinking current but with a large total layout area, by dynamically floating the gate of the unused NMOS (or PMOS) in the output buffer during the ESD stress in such manner that the unused NMOS/PMOS buffer can be turned ON to bypass the ESD current. Thus the overall ESD level of such output buffers in a cell library can be significantly improved.

THE DYNAMIC-FLOATING-GATE ARRANGEMENT

A. Circuit Configuration

Figure 4:
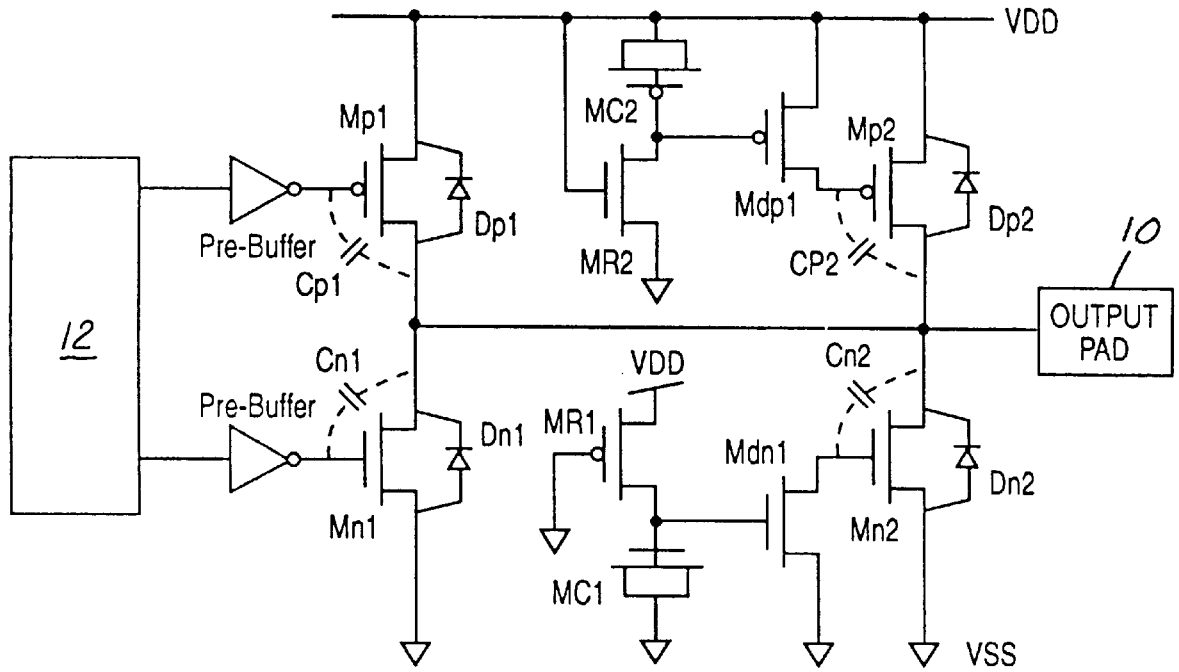
FIG. 4 is a schematic illustrating a dynamic-floating-gate arrangement in accordance with the present invention to improve the ESD level of the small-driving-current output buffers in a cell library.

A dynamic-floating-gate circuit arrangement in accordance with the invention is shown in FIG. 4. In the normal operating condition, the circuitry of FIG. 4 will have the gate of Mn2 connected to VSS and the gate of Mp2 connected to VDD respectively through small-dimension Mdn1 and Mdp1. However, it will be seen that as compared to the prior art output circuit in FIG. 2, two additional PMOS/NMOS devices, MR1 and MC1, are connected to the gate of small-dimension Mdn1 to dynamically float the gate of Mn2 during the PS-mode ESD-stress condition. Two like additional devices, MR2 and MC2, are similarly used to dynamically float the gate of Mp2 during the ND-mode ESD-stress condition. MR1 and MR2 function as resistors and MC1 and MC2 function as capacitors in the circuitry to enhance the overall ESD level of the output buffers therein in the manner as follows.

B. The Dynamic-Floating-Gate Mechanism

Figure 3:
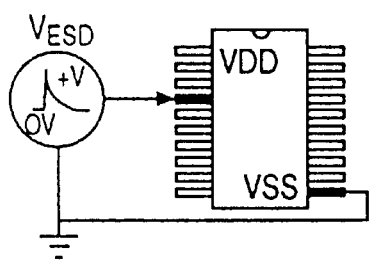
FIG. 3 illustrates four mode combinations of ESD stresses from an output pin to the VDD or VSS pins.
Figure 3:
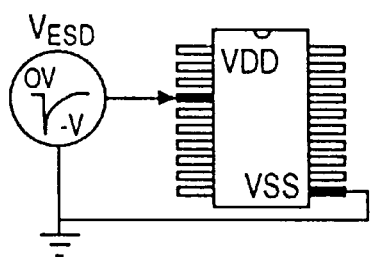
Figure 3:
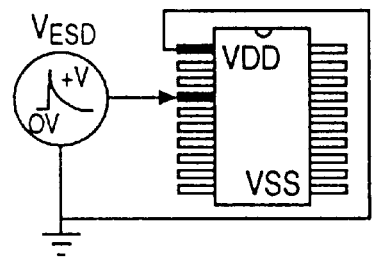
Figure 3:
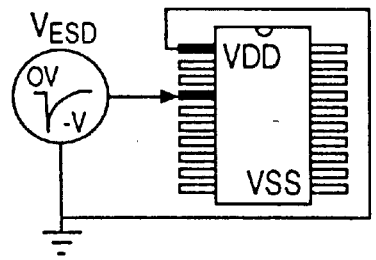

In the PS-mode ESD stress, as seen in FIG. 3, a positive (+V) ESD voltage $V_{ESD}$ is applied to the output pad 10 with the VSS grounded and the VDD floated. Due to the sharp-rising transition of the ESD voltage, the gates of NMOS devices Mn1 and Mn2 (FIG. 4) are coupled with some positive voltage through the drain-to-gate parasitic capacitance, Cn1 and Cn2, in Mn1 and Mn2. During the PS-mode ESD stress, the positive ESD voltage on the output pad 10 is also diverted into the floated VDD power line through the parasitic diodes Dp1 and Dp2 in Mp1 and Mp2. The source of PMOS MR1 is therefore charged by the ESD voltage on the VDD power line, and MR1 with a grounded gate functions as a resistor to charge the gate of Mdn1. NMOS MC1 functions as a capacitor to store the gate voltage of Mdn1. The voltage stored on the acting capacitor MC1 is zero initially, before the positive ESD voltage is applied to the output pad 10. Then, the voltage stored on the capacitor MC1 is increased through the resistor MR1 when the VDD power line is charged by the ESD current through the parasitic diode Dp2. The speed of the voltage increase on the gate of Mdn1 by means of the voltage stored on the capacitor MC1, is strongly dependent on the RC time constant determined by the values of resistor MR1 and capacitor MC1. Accordingly, the values of the resistance and capacitance in a given IC may be selected such that resistor MR1 has a high resistance and the capacitor MC1 has a large capacitance, which selection is designed to cause the gate voltage of Mdn1 to be kept below its threshold voltage for a long period. By thus keeping Mdn1 OFF for a long time, the gate of the unused Mn2, which is dynamically floating during that time period, is floated for a long time. Hence, the use of a larger resistor MR1 and a larger capacitor MC1 lead to a longer time period for floating the gate of the unused Mn2. By using this dynamic-floating design on the gate of the unused Mn2, the ESD-coupled voltage, through the drain-to-gate capacitance Cn2 of Mn2, can be held on the gate of Mn2 for a sufficiently long period to enable the unused Mn2 with a large device dimension in the small-driving current output buffer to be instantaneously turned ON to bypass the ESD current from the output pad 10 to VSS. Owing to the effective turn-on of the unused large-dimension Mn2 in the output buffer, the PS-mode ESD level of such a small-driving-current output buffer can be significantly improved.

In the ND-mode ESD stress, as seen in FIG. 3, a negative (−V) ESD voltage $V_{ESD}$ is applied to the output pad 10 with the VDD grounded and the VSS floated. The negative ESD voltage on the output pad 10 (FIG. 4) is diverted into the floated VSS power lines through the parasitic diodes Dn2 and Dn1 in Mn2 and Mn1. With the added circuitry of the invention, the NMOS MR2, with its gate connected to VDD and thus initially grounded, functions as a resistor and the PMOS MC2, connected between VDD and the gate of Mdp1, functions as a capacitor. The negative ESD voltage on the VDD power line then charges the gate of Mdp1 through the RC delay of MR2 and MC2, so that the speed of the decrease of the gate voltage of Mdp1 is strongly dependent on the RC time constant of the resistor MR2 and the capacitor MC2. Again a high-resistance MR2 and a large capacitance MC2 are thus selected to keep Mdp1 OFF for a longer time, so that the gate of the unused Mp2 can be dynamically floating for a longer time period. This dynamic-floating design on the gate of the unused Mp2, enables the negative ESD-coupled voltage through the drain-to-gate capacitance Cp2 of Mp2 to be held on the gate of Mp2 for a sufficiently long time period, so that the unused Mp2 with a large device dimension can be instantaneously turned ON to bypass the negative ESD voltage from the output pad 10 to VDD rather than discharging through Mp1. Owing to the turn-on of the unused large-dimension Mp2 in the output buffer, the ND-mode ESD level of such a small-driving-current output buffer can be significantly improved.

C. HSPICE Simulation

Figure 5:
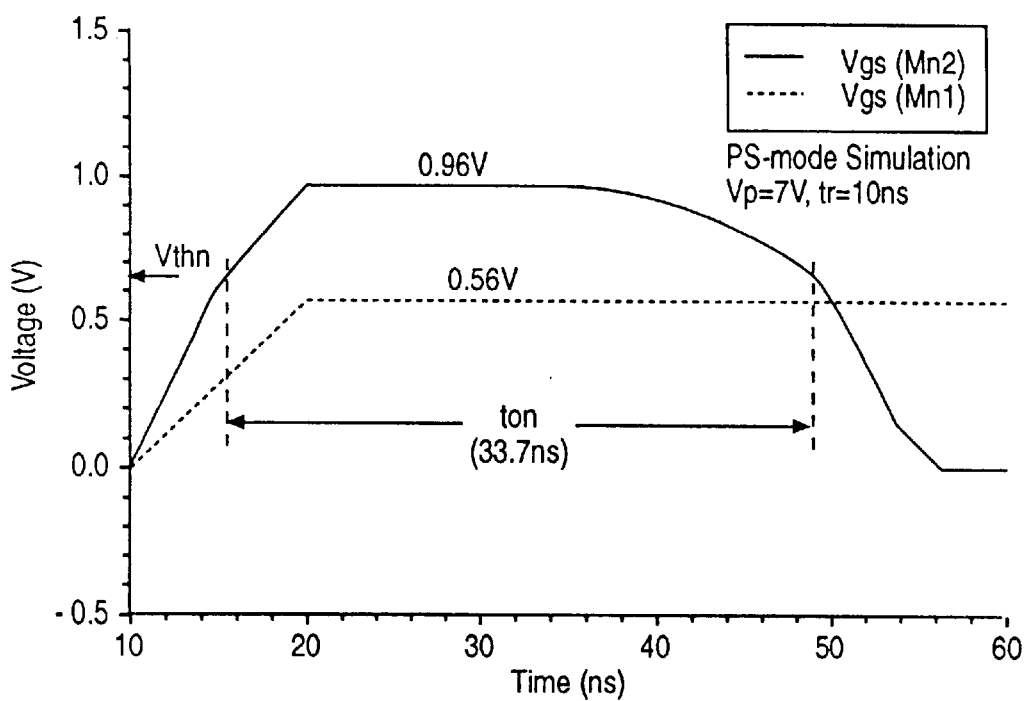
FIG. 5 is a plot illustrating the transient voltages Vgs on the gates of the output Mn1 and the unused Mn2 in the PS-mode simulation with a voltage pulse of 7 V and a rise time of 10 ns.
Figure 6:
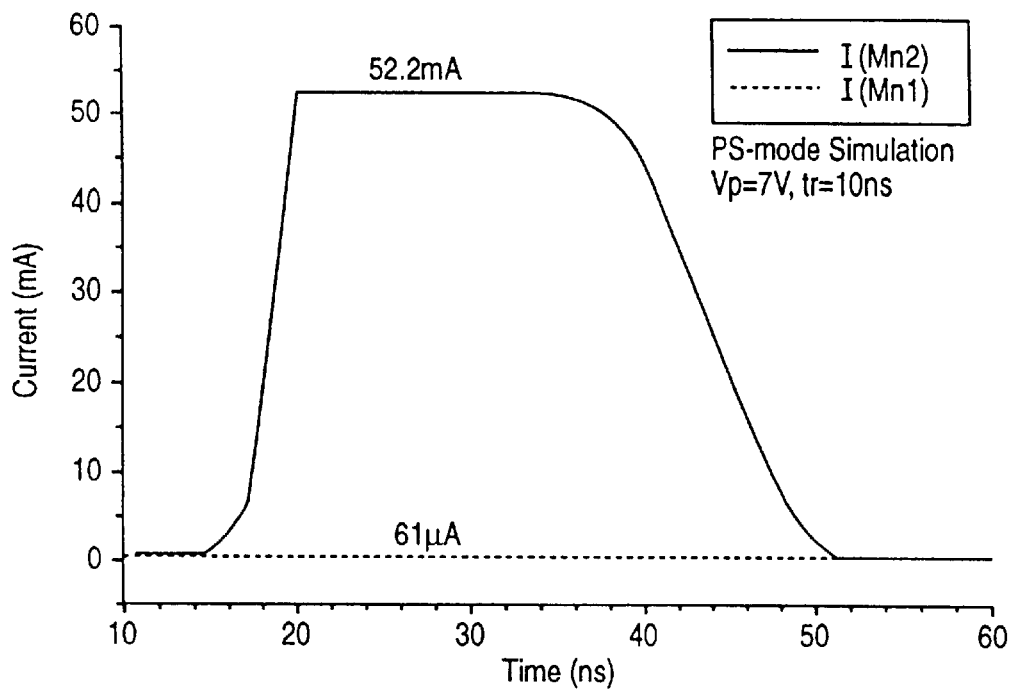
FIG. 6 is a plot illustrating the discharging currents I through the output Mn1 and the unused Mn2 in the PS-mode simulation with a voltage pulse of 7 V and a rise time of 10 ns.

To evaluate the efficiency of the dynamic-floating-gate method and means of the invention in a small-driving-current output buffer, an appropriate output circuit has been simulated and tuned by the known HSPICE in TSMC 0.35-$\mu$m CMOS technology. An ESD-like voltage pulse was added to the output pad 10 with a pulse height of 7 V and a rise time of 10 ns to simulate the PS-mode ESD-stress condition. The transient voltages Vgs on the gates of Mn1 and Mn2 were monitored and found to be as shown in FIG. 5. The discharging currents through Mn1 and Mn2 in the time domain are shown in FIG. 6. As seen in FIGS. 5 and 6, the unused Mn2 with a large device dimension can provide a much higher discharging current (52.2 mA) than the output of Mn1 (61 $\mu$A). The turn-on time tON of the unused Mn2 in the simulation is about 33.7 ns, which can be adjusted by the device dimensions (RC time constant) of the MR1 and MC1. A higher ESD voltage on the output pad 10 will couple a higher voltage through Cn2 to the gate of Mn2 and therefore cause a longer turn-on time on the Mn2.

Figure 7:
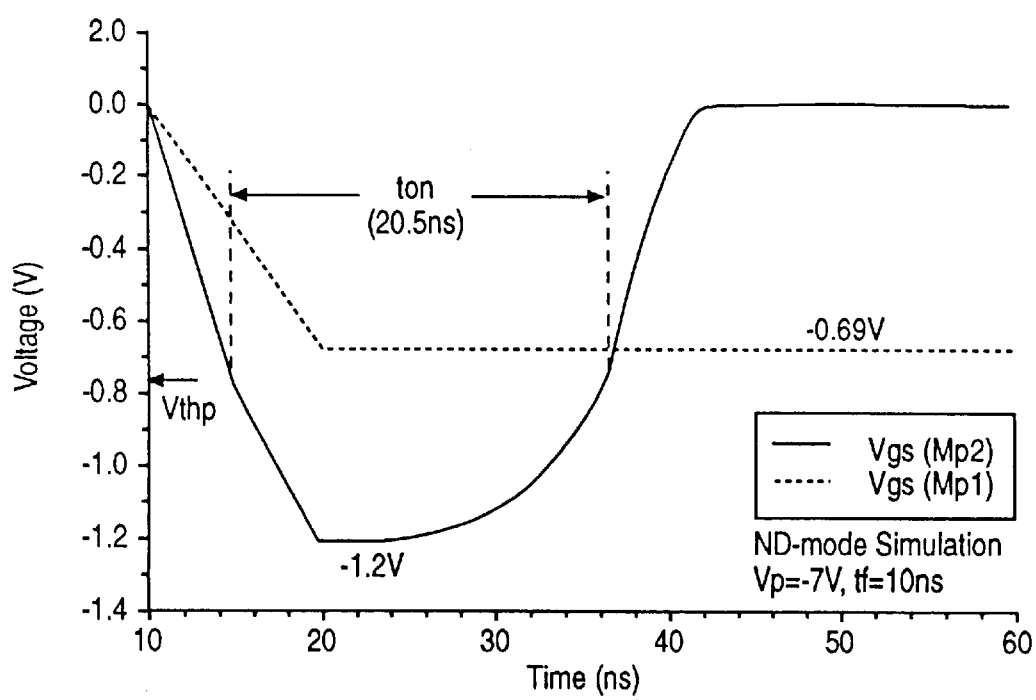
FIG. 7 is a plot illustrating the transient voltages Vgs on the gates of the output Mp1 and the unused Mp2 in the ND-mode simulation with a voltage pulse of −7 V and a fall time of 10 ns.
Figure 8:
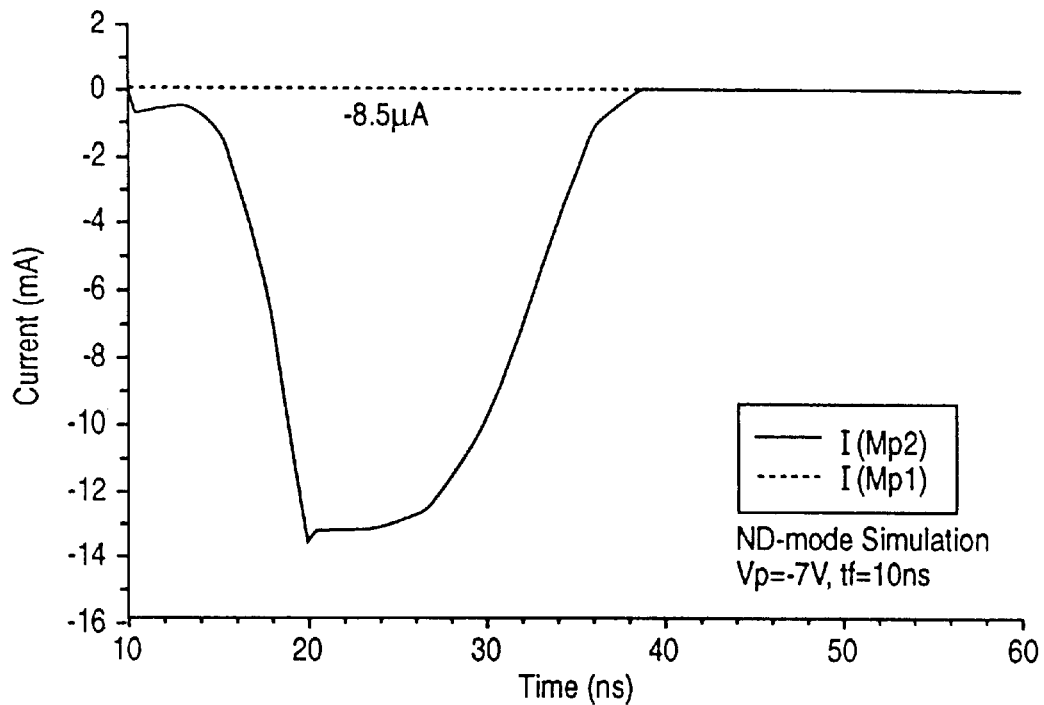
FIG. 8 is a plot illustrating the discharging currents I through the output Mp1 and the unused Mp2 in the ND-mode simulation with a voltage pulse of −7 V and a fall time of 10 ns.

The turn-on behaviors of the output circuit with the dynamic-floating-gate design of the invention has also been simulated in the ND-mode ESD-stress condition. The ND-mode ESD-like voltage had a pulse height of −7 V and a fall time of 10 ns. The simulated results are shown in FIGS. 7 and 8, where the unused Mp2 is turned on as long as 20.5 ns. Due to the large device dimension of Mp2, the discharging current (−14 mA) through unused Mp2 is much greater than that (−8.5$\mu$A) through the output Mp1. Therefore, the ESD level of the small-driving-current output buffer can be significantly improved by the unused Mp2 and Mn2, which are originally unused but then placed in the layout of the small-driving-current output buffer upon the imposition of an ESD voltage stress.

D. Experimental Results

A small-driving-current output buffer with the dynamic-floating-gate feature of the invention has also been fabricated and tested. The additional devices MR1, MC1, MR2, and MC2 were placed in the original-empty region between the output PMOS and NMOS in a TSMC 0.35-μm CMOS testchip without increasing the cell layout area of the original output buffer. The HBM (human-body-model) and MM (machine-model) ESD test results in TSMC 0.35-μm CMOS testchips, with and without the invention, are compared respectively in the following Tables II and III.

TABLE II

| | Output Buffers | |
|---|---|---|
| HBM ESD Stress | 2-mA Buffer with the Gate-Coupled Design (FIG. 2) | 2-mA Buffer with Dynamic-Floating-Gate Design (FIG. 4) |
| ND-Mode | 1500 V | >8000 V |
| PS-Mode | 1000 V | >8000 V |

TABLE III

| | Output Buffers | |
|---|---|---|
| MM ESD Stress | 2-mA Buffer with the Gate-Coupled Design (FIG. 2) | 2-mA Buffer with Dynamic-Floating-Gate Design (FIG. 4) |
| ND-Mode | 150 V | >800 V |
| PS-Mode | 100 V | >800 V |

Figure 1A:
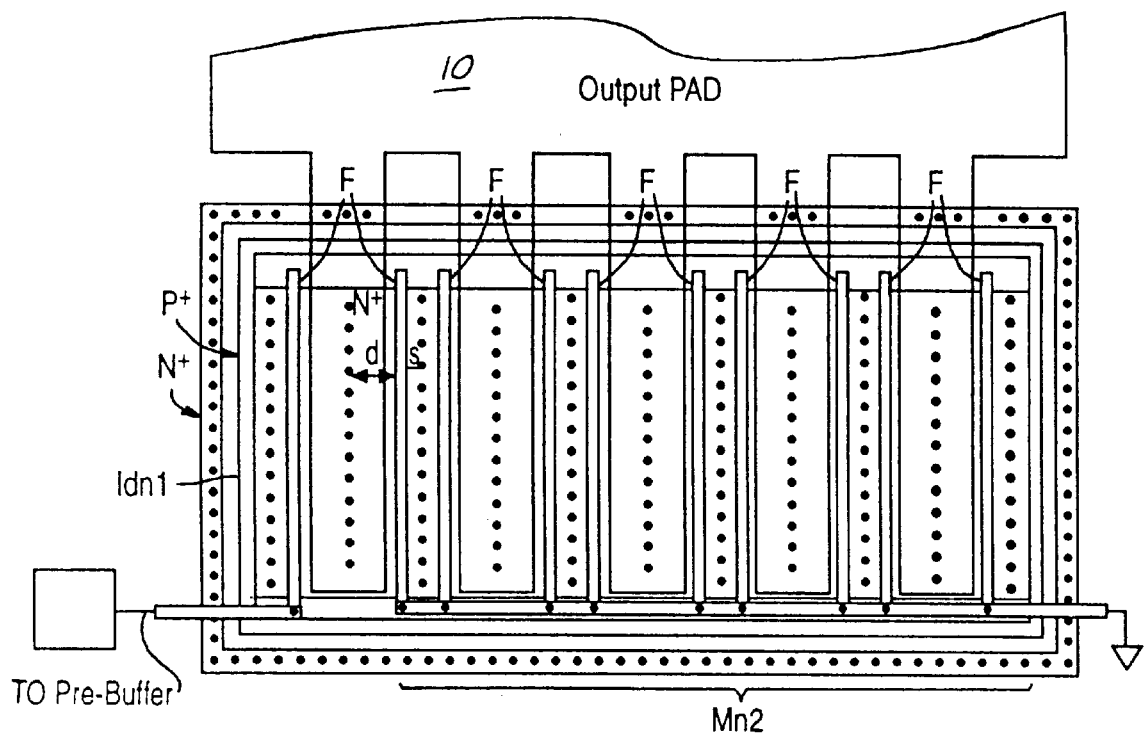
FIG. 1(a) is a diagram illustrating a layout of an output NMOS in a cell library with a small driving current specification.
Figure 1B:
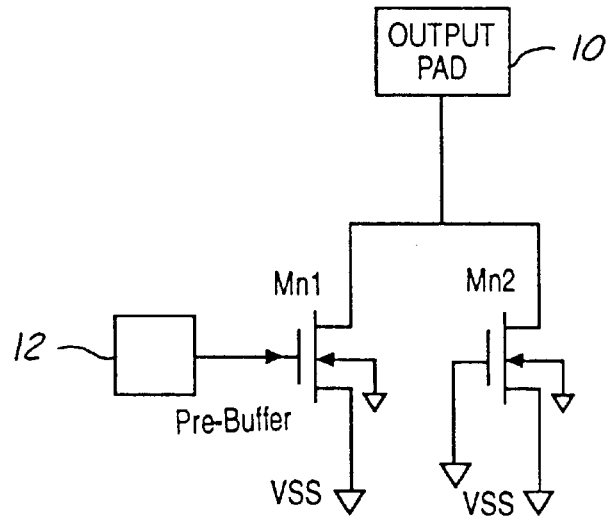
FIG. 1(b) is a schematic illustrating the equivalent circuit of the layout in FIG. 1(a) with a small-driving-current NMOS Mn1 and an unused but large-dimension NMOS Mn2.
Figure 2:
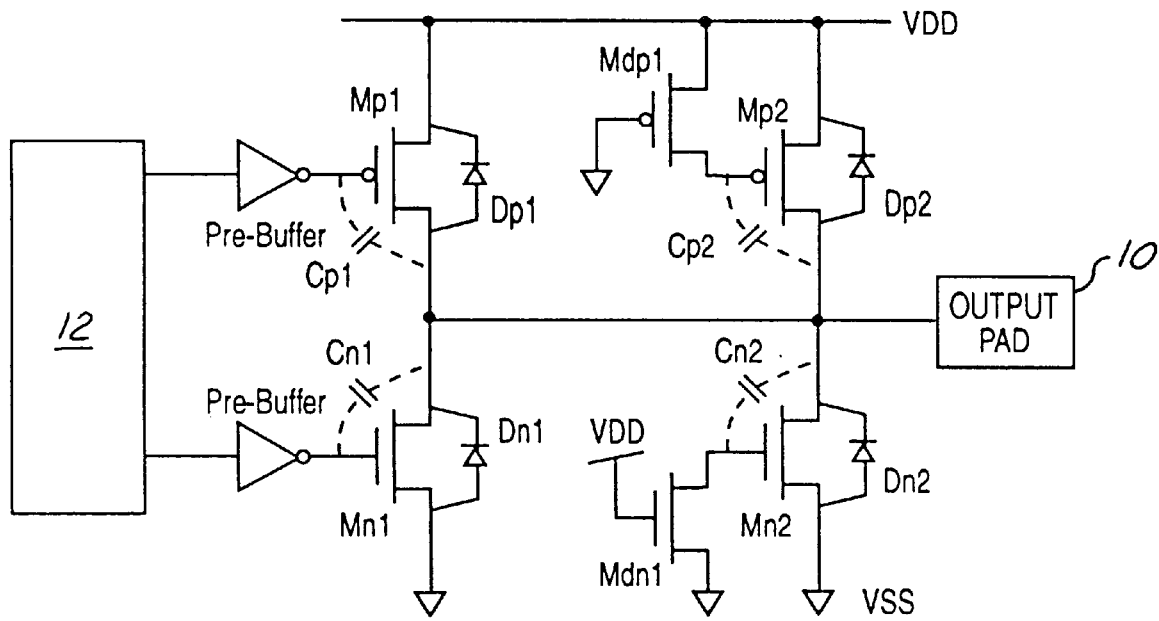
FIG. 2 is a schematic illustrating a prior art output buffer in a cell library with a small-driving-current, wherein the gate of the unused Mn2 (Mp2) is connected to VSS (VDD) through a small-dimension Mdn1 (Mdp1) to perform the gate-coupling effect for ESD protection.

It will be seen that the ND-mode and PS-mode HBM ESD levels of the 2-mA output buffer with the original protection design of the prior art in FIG. 2 is only 1.5 KV and 1.0 KV. But, the 2-mA out put buffer with the dynamic-floating-gate arrangement of the invention in FIG. 4 can sustain an ND-mode and PS-mode HBM ESD level of greater than 8 KV with the same cell layout area of the output buffer. The ND-mode and PS-mode MM (machine-model) ESD levels of the 2-mA output buffer with the original protection design of FIG. 2 is only 150 V and 100 V as shown in Table III. However, the 2-mA output buffer with the invention of FIG. 4 can sustain the ND-mode and the PS-mode MM ESD level of greater than 800 V with the same layout area of the output buffers.

The dynamic-floating-gate method and means of the invention has also been applied in the TSMC 0.25-μm CMOS cell library. The HBM ESD level of the experimental testchip has been improved to greater than 8.0 KV, which is much greater than the commercial ESD requirement of 2.0 KV.

Figure 9:
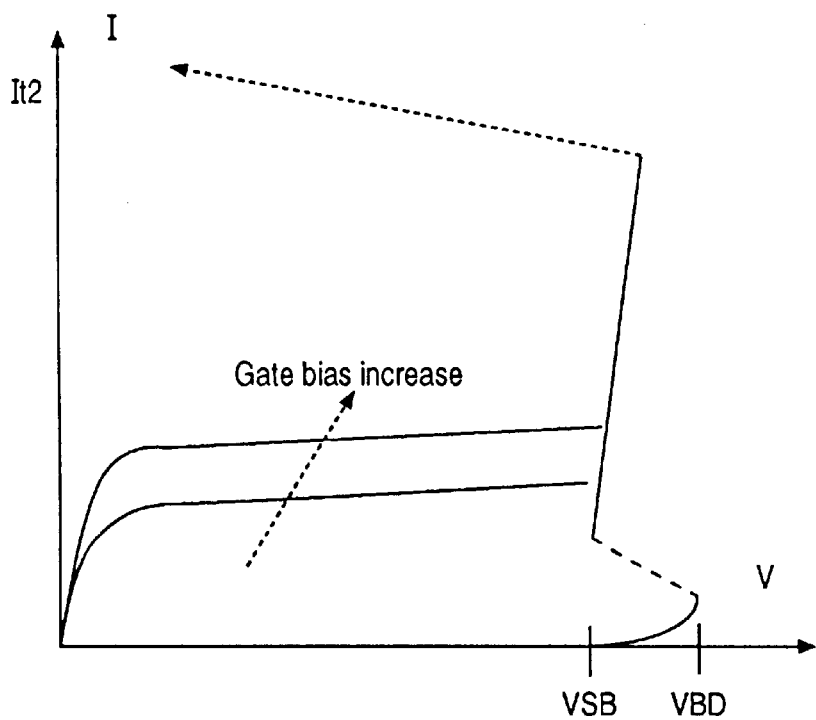
FIG. 9 is a plot illustrating the discharging currents with respect to gate bias voltage in an ESD protection circuit in accordance with the present invention.

FIG. 9 is a plot illustrating the discharging currents I with respect to gate bias voltage in an ESD protection circuit in accordance with the present invention, wherein VSB is the snap-back voltage and VBD is the break-down voltage.

Figure 10:
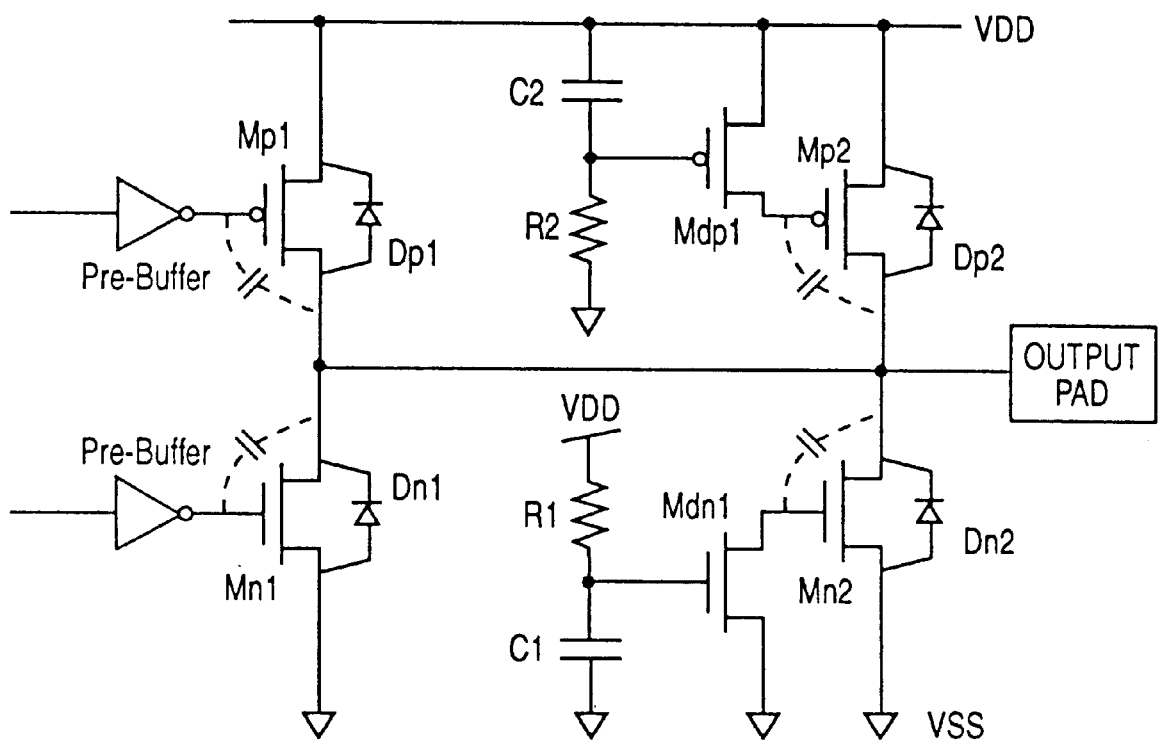
FIG. 10 is an alternative embodiment of the dynamic-floating-gate arrangement in the output buffer circuit of FIG. 4 in accordance with the invention.

An alternative embodiment of the present invention is shown in FIG. 10 wherein a resistor R1 (R2) and capacitor C1 (C2) are used to dynamically float the gate of Mn2 (Mp2) in place of MR1 (MR2) and MC1 (MC2) of FIG. 4. By adjusting the RC value by selecting the values of R1 and C1 (R2 and C2), the turn-on time of Mn2 (Mp2) during the ESD-stress condition can be tuned for different applications.

It will accordingly be seen that a novel dynamic-floating-gate design has been successfully achieved that improves the ESD level of small-driving-current output buffers, such as in the TSMC 0.35-μm and 0.25-μm CMOS cell libraries. The gates of the unused NMOS/PMOS in the output buffers are dynamically floated during the ESD stress, so that the unused NMOS/PMOS with a large device dimension can be instantaneously turned ON to bypass the ESD current. By using the dynamic-floating-gate method and means of the invention, the ND-mode (or PS mode) ESD level of the 2-mA output buffer in a cell library, such as the TSMC CMOS cell library, can be significally improved from the original 1.5 KV (or 1.0 KV) up to greater than 8.0 KV without increasing the total layout area of the output cell.

What is claimed is:

1. An apparatus for improving the ESD robustness of driving-current-programmable CMOS output buffers in cell libraries, comprising:

a connection to an output pad;

a connection to a pre-buffer circuit;

a finger-type output CMOS having a plurality of poly-gate fingers connected to said output pad connection and with at least one CMOS output buffer finger connected to said pre-buffer circuit connection and the remaining unused CMOS output buffer fingers connected to one of two voltage sources; and means for dynamically floating the gate of the unused CMOS output buffer during ESD stress from an ESD voltage on said output pad connection, so that the unused CMOS output buffer can be turned ON to bypass the ESD current, said means comprising:

a resistance connected between said two voltage sources;

a capacitance connected between said resistance and said one of said two voltage sources; and a small-dimension CMOS device having its drain connected to the gate of said unused CMOS buffer, its source connected to said one of said two voltage sources, and its gate connected between said resistance and said capacitance.

2. The apparatus as in claim 1 wherein said ESD stress is PS-mode ESD stress, said one of two voltages is negative, and said CMOS output buffers comprise NMOS devices.

3. The apparatus as in claim 2 wherein said resistance comprises a PMOS device with an initially grounded gate and said capacitance comprises an NMOS device.

4. The apparatus as in claim 3 wherein said small-dimension CMOS device comprises an NMOS device.

5. The apparatus as in claim 1 wherein said ESD stress is ND-mode ESD stress, said one of two voltages is positive, and said CMOS output buffers comprise PMOS devices.

6. The apparatus as in claim 5 wherein said resistance comprises an NMOS device with an initially grounded gate and said capacitance comprises a PMOS device.

7. The apparatus as in claim 6 wherein said small-dimension CMOS device comprises a PMOS device.

8. The apparatus as in claim 1 wherein said resistance comprises a high resistance and said capacitance comprises a high capacitance for providing a long RC time constant in charging the gate of said small-dimension CMOS device.

9. A method for improving the ESD robustness of driving-current-programmable CMOS output buffers in cell libraries, comprising the steps of:

providing a finger-type output CMOS having a plurality of poly-gate fingers connected at one end to an output pad;

connecting the other end of at least one of said CMOS output buffer fingers to a pre-buffer circuit;

connecting the other ends of the remaining unused CMOS output buffer fingers to ground; and dynamically floating the gate of the unused CMOS output buffer during ESD stress, so that the unused CMOS output buffer can be turned ON to bypass the ESD current by the steps of:

connecting a resistance to a voltage source;

connecting a capacitance between said resistance and ground; and connecting a small-dimension CMOS device with its drain connected to the gate of said unused CMOS buffer, its source connected to ground, and its gate connected between said resistance and said capacitance.

10. The method of claim 9 wherein when said ESD stress is PS-mode ESD stress, said one of two voltages is negative, and said CMOS output buffers are selected to comprise NMOS devices.

11. The method of claim 10 wherein said resistance is selected to comprise a PMOS device with an initially grounded gate and said capacitance is selected to comprise an NMOS device.

12. The method of claim 11 wherein said small-dimension CMOS device is selected to comprise an NMOS device.

13. The method of claim 9 wherein when said ESD stress is ND-mode ESD stress, said one of two voltages is positive, and said CMOS output buffers are selected to comprise PMOS devices.

14. The method of claim 13 wherein said resistance is selected to comprise an NMOS device with an initially grounded gate and said capacitance is selected to comprise a PMOS device.

15. The method of claim 14 wherein said small-dimension CMOS device is selected to comprise a PMOS device.

16. The method of claim 9 wherein said resistance is selected to comprise a high resistance and said capacitance is selected to comprise a high capacitance to provide a long RC time constant in charging the gate of said small-dimension CMOS device.

17. A driving-current-programmable output CMOS having a plurality of poly-gate fingers connected to an output and with at least one CMOS output buffer finger connected to a pre-buffer circuit and the remaining unused CMOS output buffer fingers connected to one of two voltage sources, wherein the improvement comprises:

means for dynamically floating the gates of the unused CMOS output buffers during ESD stress from an ESD voltage on said output, so that the unused CMOS output buffers can be turned ON to bypass the ESD current, said means comprising:

at least one resistance connected between said two voltage sources;

at least one capacitances connected between said resistance and said one of said two voltage sources; and at least one small-dimension CMOS device having its drain connected to the gate of one of said unused CMOS buffers, its source connected to said one of said two voltage sources, and its gate connected between said one resistance and said one capacitance.

18. A driving-current-programmable output CMOS as in claim 17 wherein said ESD stress is PS-mode ESD stress, said one of two voltages is negative, and said CMOS output buffers comprise NMOS devices.

19. A driving-current-programmable output CMOS as in claim 18 wherein said resistance comprises a PMOS device with an initially grounded gate and said capacitance comprises an NMOS device.

20. A driving-current-programmable output CMOS as in claim 19 wherein said small-dimension CMOS device comprises an NMOS device.

* * * * *